(12) United States Patent
Shibusawa et al.

(10) Patent No.: US 8,616,732 B2
(45) Date of Patent: Dec. 31, 2013

(54) LIGHT-EMITTING DEVICE AND ILLUMINATION DEVICE

(75) Inventors: Soichi Shibusawa, Yokosuka (JP); Kozo Ogawa, Yokosuka (JP); Kiyoshi Nishimura, Yokosuka (JP); Nobuhiko Betsuda, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 168 days.

(21) Appl. No.: 13/024,376

(22) Filed: Feb. 10, 2011

(65) Prior Publication Data

US 2011/0199772 A1 Aug. 18, 2011

(30) Foreign Application Priority Data

Feb. 12, 2010 (JP) ................................. 2010-029542
Jan. 20, 2011 (JP) ................................. 2011-010021

(51) Int. Cl.
*F21V 7/00* (2006.01)

(52) U.S. Cl.
USPC ........ 362/310; 362/267; 362/249.02; 257/98; 257/100

(58) Field of Classification Search
USPC ............ 362/267, 310, 311.02, 800, 237, 240, 362/247, 249.02; 257/98–100
See application file for complete search history.

(56) References Cited

U.S. PATENT DOCUMENTS

| 7,021,799 | B2 | 4/2006 | Mizuyoshi |
| 7,736,920 | B1* | 6/2010 | Wu et al. .................. 438/22 |
| 2004/0211970 | A1* | 10/2004 | Hayashimoto et al. ......... 257/98 |
| 2005/0285926 | A1 | 12/2005 | Mizuyoshi |
| 2007/0176198 | A1 | 8/2007 | Lee et al. |
| 2007/0290328 | A1 | 12/2007 | Lin |
| 2008/0068862 | A1 | 3/2008 | Shimura |
| 2008/0117619 | A1 | 5/2008 | Pang |
| 2008/0273327 | A1 | 11/2008 | Wilcox |
| 2009/0103325 | A1 | 4/2009 | Dubuc |
| 2010/0277914 | A1 | 11/2010 | Bachl |

FOREIGN PATENT DOCUMENTS

| CN | 1466782 | 1/2004 |
| CN | 1846318 | 10/2006 |
| CN | 101213892 | 7/2008 |
| CN | 101445644 | 6/2009 |
| CN | 201302063 | 8/2009 |
| JP | 11-054769 | 2/1999 |
| JP | 2006-351708 | 12/2006 |

(Continued)

OTHER PUBLICATIONS

English Abstract of JP 2008-085302 published Apr. 10, 2008.

(Continued)

*Primary Examiner* — Thomas Sember
(74) *Attorney, Agent, or Firm* — DLA Piper LLP (US)

(57) ABSTRACT

According to one embodiment, a light-emitting device comprises a substrate on a surface of which a light-emitting element is mounted, a light reflection layer formed on a second area of the surface of the substrate other than a first area on which the light-emitting element is mounted, and a sealing member sealing the light-emitting element. An engagement protrusion part protruding toward the sealing member is provided at an edge part of the light reflection layer at which the light reflection layer is in contact with the area on which the light-emitting element is mounted. The engagement protrusion part juts out into the sealing member to prevent exfoliation of the sealing member.

8 Claims, 9 Drawing Sheets

(56) References Cited

FOREIGN PATENT DOCUMENTS

| | | |
|---|---|---|
| JP | 2008-047604 | 2/2008 |
| JP | 2008-085302 | 4/2008 |
| JP | 2008-166081 | 7/2008 |
| JP | 2008-166462 | 7/2008 |
| JP | 2008-166611 | 7/2008 |
| JP | 2008-198782 | 8/2008 |
| JP | 2008-258296 | 10/2008 |
| JP | 2009-040884 | 2/2009 |
| JP | 2009-054989 | 3/2009 |
| WO | WO 2009/090867 | 7/2009 |

OTHER PUBLICATIONS

English Translation of JP 2008-085302 published Apr. 10, 2008.
English Abstract of JP 2009-054989 published Mar. 12, 2009.
English Translation of JP 2009-054989 published Mar. 12, 2009.
English Abastract of JP 2008-166081 published Jul. 17, 2008.
English Translation of JP 2008-166081 published Jul. 17, 2008.
Chinese Office Action issued in CN 201110037800.7 mailed Oct. 8, 2012.
English Language Translation of Chinese Office Action issued in CN 201110037800.7 mailed Oct. 8, 2012.
English Language Abstract of JP 2006-351708 published Dec. 28, 2006.
English Language Translation of JP 2006-351708 published Dec. 28, 2006.
English Language Abstract of CN 1846318 published Sep. 2, 2009.
English Language Abstract of CN 1846318 published Oct. 11, 2006.
Related U.S. Appl. No. 13/024,384 electronically captured on Jan. 8, 2013.
Chinese Office Action issued in CN 201110037796.4 on Feb. 4, 2013.
English Language Translation of Chinese Office Action issued in CN 201110037796.4 on Feb. 4, 2013.
English Language Abstract of CN 101445644 published Jun. 3, 2009.
English Language Abstract of JP 2008-166462 published Jul. 17, 2008.
English Language Translation of JP 2008-166462 published Jul. 17, 2008.
English Language Abstract of JP 2008-198782 published Aug. 28, 2008.
English Language Translation of JP 2008-198782 published Aug. 28, 2008.
English Language Abstract of CN 101213892 published Jul. 2, 2008.
English Language Abstract of CN 1466782 published Jan. 7, 2004.
Related U.S. Appl. No. 13/024,384 electronically captured on May 3, 2013.
U.S. Appl. No. 13/024,384 electronically captured on Aug. 22, 2013 between May 22, 2013 and Aug. 22, 2013.
Japanese Office Action issued in JP 2010-029542 on Jun. 25, 2013.
English Language Translation of Japanese Office Action issued in JP 2010-029542 on Jun. 25, 2013.
English Language Abstract of JP 11-054769 published Feb. 26, 1999.
English Language Translation of JP 11-054769 published Feb. 26, 1999.
English Language Abstract of JP 2008-166611 published Jul. 17, 2008.
English Language Translation of JP 2008-166611 published Jul. 17, 2008.
English Language Abstract of JP 2008-047604 published Feb. 28, 2008.
English Language Translation of JP 2008-047604 published Feb. 28, 2008.
English Language Abstract of JP 2009-040884 published Feb. 26, 2009.
English Language Translation of JP 2009-040884 published Feb. 26, 2009.
English Language Abstract of JP 2008-258296 published Oct. 23, 2008.
English Language Translation of JP 2008-258296 published Oct. 23, 2008.
English Language Abstract of WO2009-090867 published May 26, 2011.
U.S. Appl. No. 13/024,384 electronically captured on Sep. 24, 2013 between Aug. 22, 2013 and Sep. 24, 2013.
Extended Search Report for EP 11154159.5 issued on Aug. 21, 2013.
Chinese Office Action issued in CN 201110037796.4 issued on Oct. 12, 2013.
English Language Translation for Chinese Office Action issued in CN 201110037796.4 issued on Oct. 12, 2013.
English Language Abstract and Translation for JP 2008-166462 published on Jul. 17, 2008.

* cited by examiner

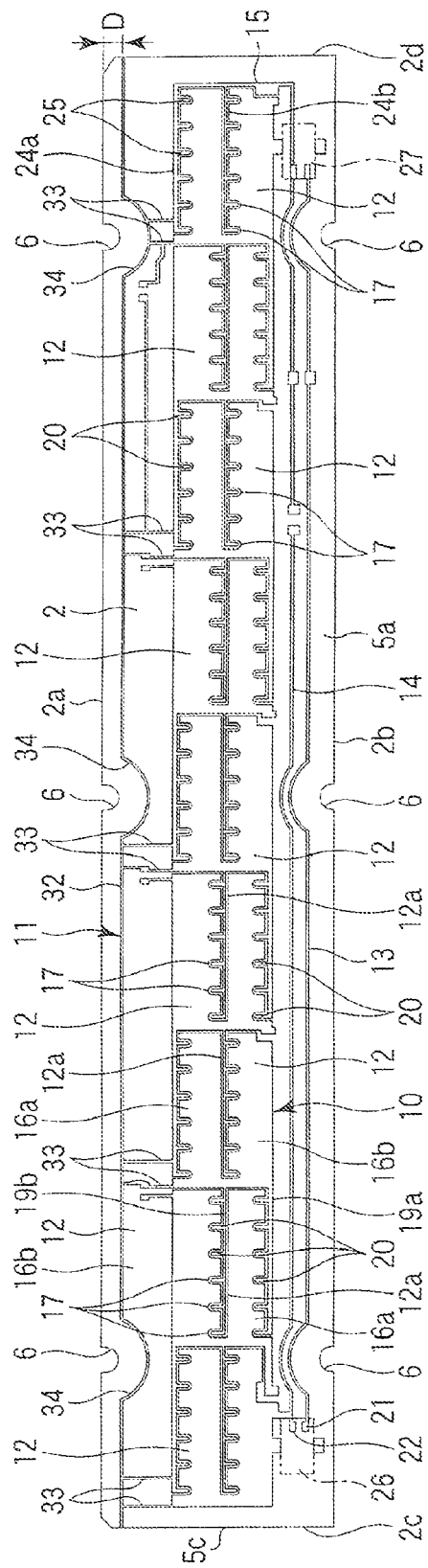
F I G. 2

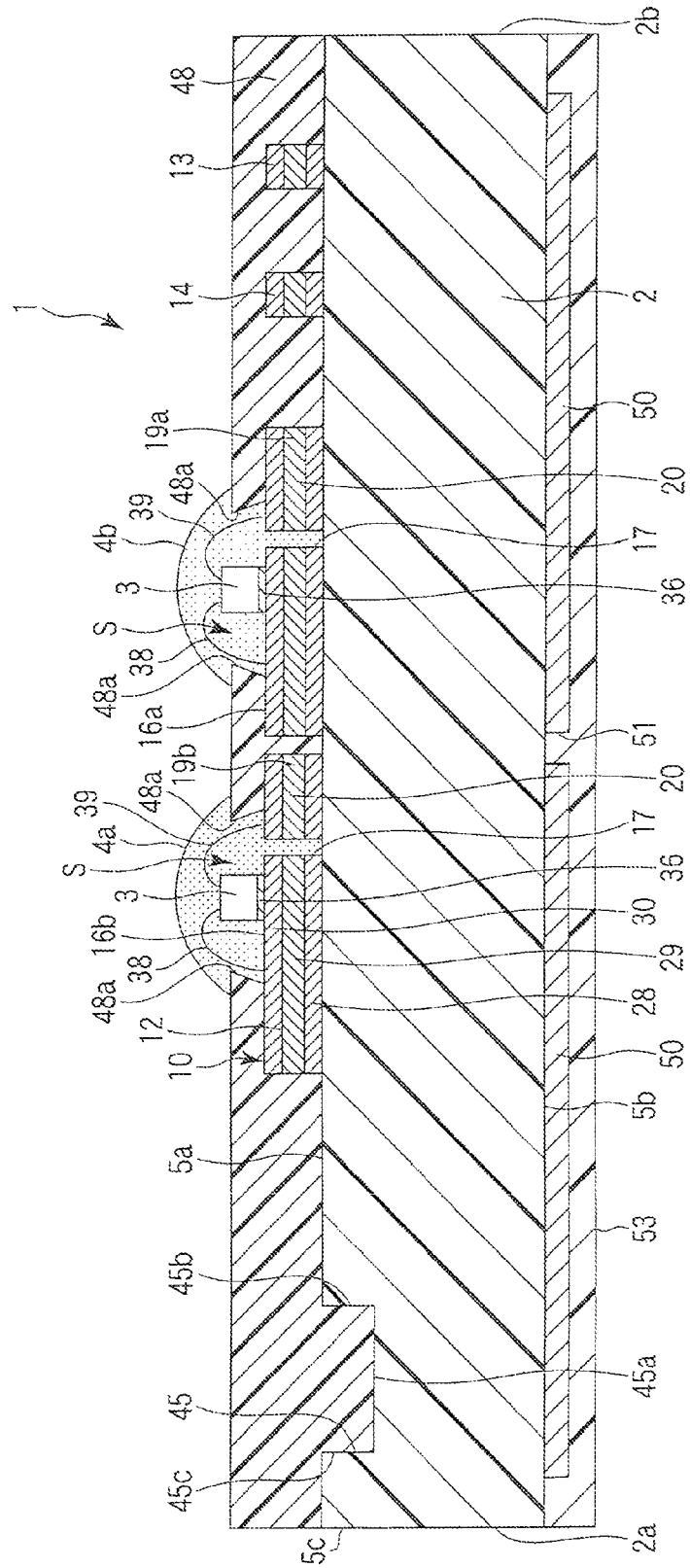
F I G. 5

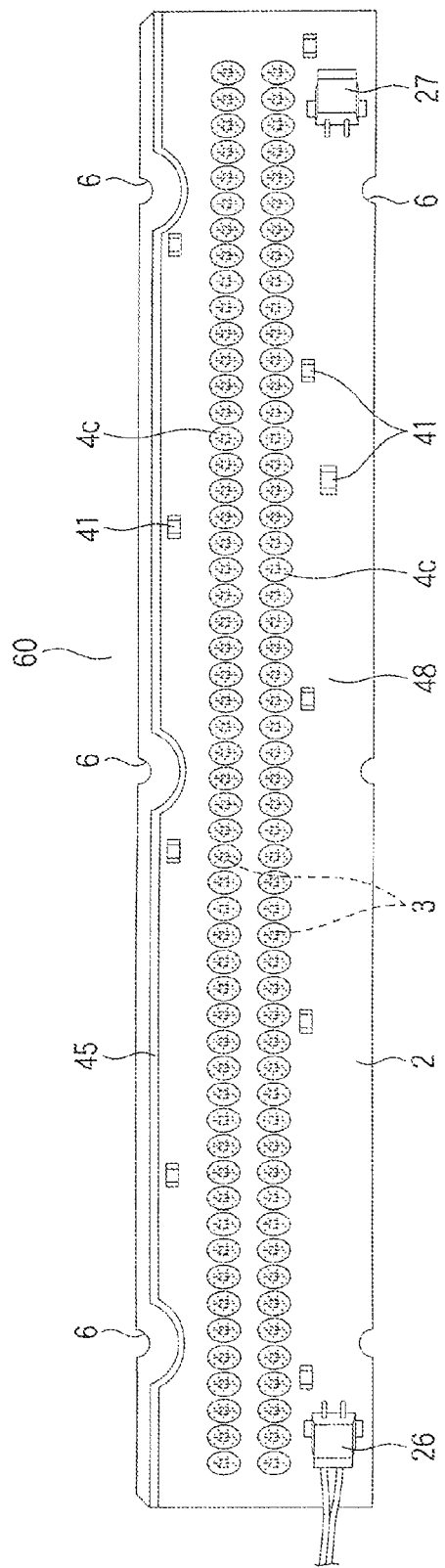
F I G. 8

LIGHT-EMITTING DEVICE AND ILLUMINATION DEVICE

CROSS-REFERENCE TO RELATED APPLICATIONS

This application is based upon and claims the benefit of priority from Japanese Patent Applications No. 2010-029542, filed Feb. 12, 2010; and No. 2011-010021, filed Jan. 20, 2011; the entire contents of both of which are incorporated herein by reference.

FIELD

Embodiments described herein relate generally to a light-emitting device and illumination device using a light-emitting element such as a light-emitting diode (LED) or the like.

BACKGROUND

In recent years, illumination devices using a plurality of light-emitting diodes as a light source have been put into practical use. The illumination devices of this type are used as, for example, surface-mounted general lighting which is directly mounted on the indoor ceiling.

A light-emitting diode is mounted on a substrate, and is sealed with a sealing member. For example, a material obtained by mixing a fluorescent substance into a transparent silicon resin or the like can be used as the sealing member. The sealing member is poured into the inside of a framework member surrounding the light-emitting diode to be solidified, for example. However, in general, such a framework member lowers the luminous efficacy of the light-emitting diode.

Thus, a method of sealing the light-emitting diode by using only the sealing member without providing a framework member is proposed.

When the framework member is not provided, the sealing member is bonded to the substrate. When force, for example lateral force, is applied to the sealing member, the sealing member is liable to be exfoliated from the substrate.

Accordingly, development of a light-emitting device and illumination device in which exfoliation of a sealing member configured to seal a light-emitting element can be prevented is demanded.

BRIEF DESCRIPTION OF THE DRAWINGS

FIG. 2 is a schematic view showing a conductor pattern on a substrate of the light-emitting device of FIG. 1.

FIG. 5 is a cross-sectional view taken along line F5-F5 of FIG. 1.

FIG. 8 is a schematic view of a light-emitting device according to a second embodiment viewed from the top surface side.

DETAILED DESCRIPTION

Figure 1:
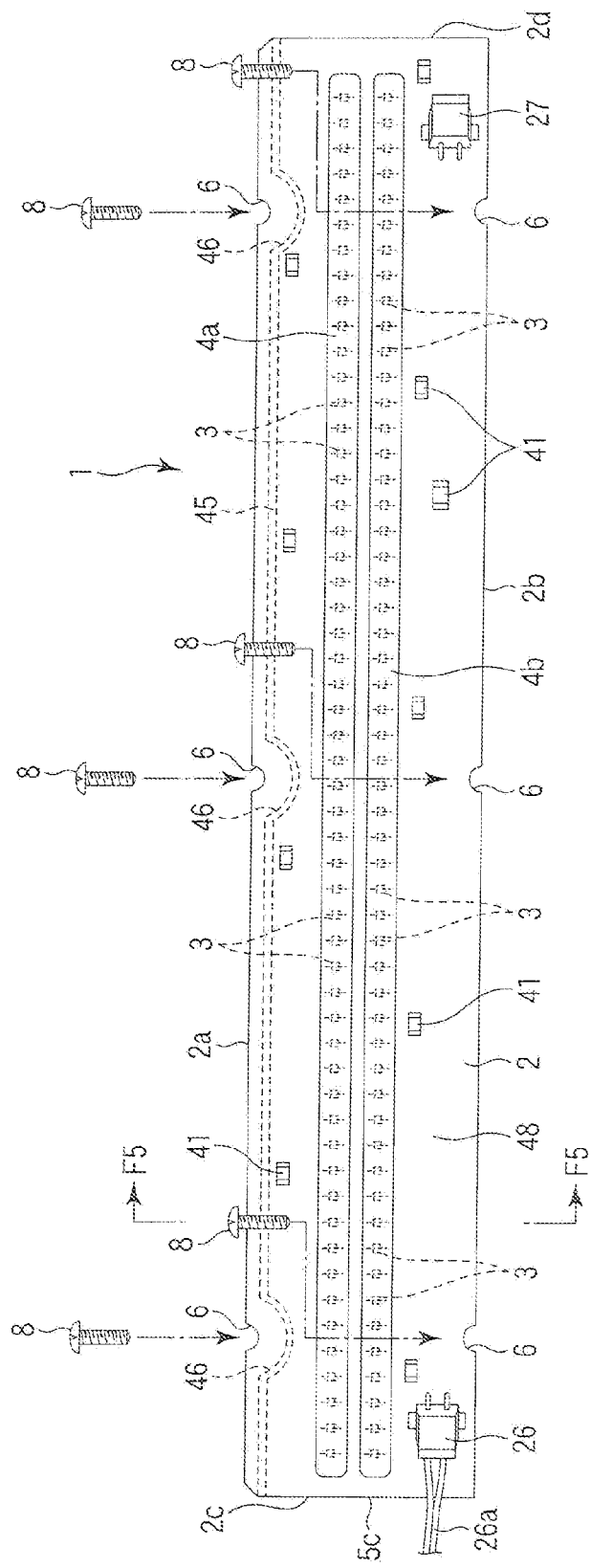
FIG. 1 is a schematic view of a light-emitting device according to a first embodiment viewed from the top surface side.

In general, according to one embodiment, a light-emitting device 1 comprises a substrate 2 on a surface 5a of which a light-emitting element 3 is mounted; a light reflection layer 48 formed on a second area of the surface of the substrate other than a first area S on which the light-emitting element 3 is mounted; and a sealing member 4a, 4b sealing the light-emitting element 3. An engagement protrusion part 48a protruding toward the sealing member 4a, 4b is provided at an edge part of the light reflection layer 48 at which the light reflection layer 48 is in contact with the area S on which the light-emitting element 3 is mounted. The engagement protrusion part 48a juts out into the sealing member 4a, 4b to prevent exfoliation of the sealing Member 4a, 4b.

Various embodiments will be described hereinafter with reference to the accompanying drawings.

(First Embodiment)

Hereinafter, a first embodiment will be described below with reference to FIGS. 1 to 7. FIGS. 1 to 6 show a light-emitting device 1, and FIG. 7 shows an illumination device 100 using this light-emitting device 1. It should be noted that in each drawing, the same parts are denoted by the same reference symbols, and a duplicate description is omitted.

The light-emitting device 1 serving as an illumination light source comprises a substrate 2, a plurality of light-emitting elements 3, and a pair of sealing members 4a and 4b. The substrate 2 is formed of a synthetic resin material such as a glass epoxy resin. The substrate 2 is formed into a long and thin shape having a pair of long sides 2a and 2b, and a pair of short sides 2c and 2d. Furthermore, the substrate 2 has a first surface 5a, second surface 5b positioned on the opposite side of the first surface 5a, and outer peripheral surface 5c connecting the first surface 5a and second surface 5b to each other. Both the first and second surfaces 5a and 5b are flat surfaces. According to this embodiment, a length of the substrate 2 along the long side 2a or 2b is 230 mm, and width thereof along the short side 2c or 2d is 35 mm. Furthermore, it is desirable that a thickness of the substrate 2 be 0.5 mm to 1.8 mm. In this embodiment, a substrate 2 having a thickness dimension of 1.0 mm is used.

The shape of the substrate 2 is not limited to the rectangular shape, and may be a square or circular shape. Further, as the material for the substrate 2, ceramics material or other synthetic resin materials can be used. Furthermore, in order to enhance the heat radiation performance of each light-emitting element 3, a metallic substrate in which an insulating layer is formed on one surface of a base plate made of aluminum or the like, having high thermal conductivity, and excellent in heat radiation may be used as the substrate 2.

A plurality of piercing parts 6 are formed at end edges defining the long sides 2a and 2b of the substrate 2. The piercing parts 6 are arcuate cutout parts opened to the outer peripheral surface 5c of the substrate 2, and pierce through the substrate 2 in a thickness direction. Furthermore, the piercing parts 6 are arranged at intervals in the longitudinal direction of the substrate 2.

A plurality of screws 8 are inserted through the respective piercing parts 6. The screws 8 are an example of fixing parts configured to fix the substrate 2 to a base of the illumination device, and are screwed into the base through the piercing parts 6. In a state where the screws 8 are screwed into the base, the end edge of the substrate 2 is held between head parts of the screws 8 and the base. Hereby, the substrate 2 is fixed to the base.

As shown in FIG. 2, a first conductor pattern 10 and second conductor pattern 11 are formed on the first surface 5*a* of the substrate 2. The first conductor pattern 10 includes, for example, nine pads 12, a positive power supply conductor 13, negative power supply conductor 14, and relay conductor 15. The pads 12 have a rectangular shape, and are arranged in line at intervals in the longitudinal direction of the substrate 2.

Each pad 12 is divided into a first mounting area 16*a* and second mounting area 16*b* by a slit 12*a*. The slit 12*a* linearly extends in a central part of the pad 12 in the longitudinal direction of the substrate 2, and is opened to one end of the pad 12. Six depressed parts 17 are formed in the first mounting area 16*a* of each pad 12. The depressed parts 17 are opened to one side edge of the pad 12, and are arranged in line at intervals in the longitudinal direction of the substrate 2. Likewise, six depressed parts 17 are formed in the second mounting area 16*b* of each pad 12. The depressed parts 17 are opened to the slit 12*a*, and are arranged in line at intervals in the longitudinal direction of the substrate 2.

As shown in FIG. 2, each of the pads 12 other than one pad 12 positioned at the left end of the substrate 2 has a pair of extension parts 19*a* and 19*b*. The extension parts 19*a* and 19*b* linearly extend from one end of the pad 12 in the longitudinal direction of the substrate 2, and are arranged in parallel with each other with an interval held between them. Each of the extension parts 19*a* and 19*b* has six power supply terminals 20. The power supply terminals 20 are projected from the extension parts 19*a* and 19*b*, and are arranged in line at intervals in the longitudinal direction of the substrate 2.

One extension part 19*a* of each pad 12 extends along one side edge of the adjacent pad 12. The power supply terminals 20 of the extension part 19*a* are inserted into the respective depressed parts 17 opened to one side edge of the pad 12. The extension part 19*a* and the side edge of the pad 12 are electrically separated from each other by providing an insulating space between them. Likewise, the power supply terminals 20 of the extension part 19*a* and depressed parts 17 are electrically separated from each other by providing insulating spaces between them.

The other extension part 19*b* of each pad 12 is inserted into the slit 12*a* of the adjacent pad 12. The power supply terminals 20 of the extension part 19*b* are inserted into the respective depressed parts 17 opened to the slit 12*a*. The extension part 19*b* and pad 12 are electrically separated, from each other by an insulating space positioned inside the slit 12*a*. Likewise, the power supply terminals 20 of the extension part 19*b* and depressed parts 17 are electrically separated from each other by providing insulating spaces between them.

Therefore, as is clear from FIG. 2, the plurality of pads 12 are arranged in line in the longitudinal direction of the substrate 2, in a state where the extension parts 19*a* and 19*b* are alternately reversed in the width direction of the substrate 2.

As shown in FIG. 2, the positive power supply conductor 13 extends over the whole length of the substrate 2 to run along the long side 2*b* of the substrate 2. The negative power supply conductor 14 extends in the longitudinal direction of the substrate 2 to run along the long side 2*b* of the substrate 2. The left end of the negative power supply conductor 14 is connected to the pad 12 positioned at the left end of the substrate 2.

The positive power supply conductor 13 has a positive electrode terminal 21. Likewise, the negative power supply conductor 14 has a negative electrode terminal 22. The positive electrode terminal 21 and negative electrode terminal 22 are arranged side by side with an interval held between them at the left end part of the substrate 2.

The relay conductor 15 extends in the longitudinal direction of the substrate 2 to run along the long side 2*b* of the substrate 2. The relay conductor 15 is positioned at a right end part of the substrate 2. The relay conductor 15 includes a pair of power supply patterns 24*a* and 24*b*. The power supply patterns 24*a* and 24*b* linearly extend in the longitudinal direction of the substrate 2, and are arranged in parallel with each other with an interval held between them. Each of the power supply patterns 24*a* and 24*b* has six power supply terminals 25. The power supply terminals 25 are projected from the power supply patterns 24*a* and 24*b*, and are arranged in line at intervals in the longitudinal direction of the substrate 2.

One power supply pattern 24*a* extends along one side edge of the pad 12 positioned at the right end of the substrate 2. The power supply terminals 25 of the power supply pattern 24*a* are inserted into the respective depressed parts 17 opened to the side edge of the pad 12. The power supply pattern 24*a* and side edge of the pad 12 are electrically separated from each other by providing an insulating space between them. Likewise, the power supply terminals 25 of the power supply pattern 24*a* and the depressed parts 17 of the pad 12 are electrically separated from each other by providing insulating spaces between them.

The other power supply pattern 24*b* is inserted into the slit 12*a* of the pad 12 positioned at the right end of the substrate 2. The power supply terminals 25 of the power supply pattern 24*b* are inserted into the respective depressed parts 17 opened to the slit 12*a*. The power supply pattern 24*b* and pad 12 are electrically separated from each other by an insulating space positioned inside the slit 12*a*. Likewise, the power supply terminals 25 of the power supply pattern 24*b* and the depressed parts 17 of the pad 12 are electrically separated from each other by providing insulating spaces between them.

As shown in FIG. 1 and FIG. 2, a power supply connector 26 is soldered to the positive electrode terminal 21 and negative electrode terminal 22. The power supply connector 26 is positioned on the first surface 5*a* of the substrate 2, and is electrically connected to a power supply circuit through lead wires 26*a*. Furthermore, the negative power supply conductor 14 and relay conductor 15 are short-circuited through a relay connector 27.

As shown in FIG. 5, the first conductor pattern 10 including the pads 12 has a three-layer structure including a copper layer 28, nickel-plated layer 29, and silver-plated layer 30. The copper layer 28 is formed by etching a copper foil layer formed on the first surface 5*a* of the substrate 2. The nickel-plated layer 29 is formed on the copper layer 28 by subjecting the copper layer 28 to electrolytic plating. The silver-plated layer 30 is formed on the nickel-plated layer 29 by subjecting the nickel-plated layer 29 to electrolytic plating. The silver-plated layer 30 covers the nickel-plated layer 29, and constitutes a reflecting layer exposed on the surface of the first conductor pattern 10. Therefore, the surface of the first conductor pattern 10 is a light-reflecting surface. The total reflectivity of this light-reflecting surface is about 90%.

It is desirable that the nickel-plated layer 29 should have a film thickness of 5 µm or more. Likewise, it is desirable that the silver-plated layer 30 should have a film thickness of 1 µm or more. By specifying the film thicknesses of the nickel-plated layer 29 and silver-plated layer 30 in such a manner, it is possible to eliminate variations in thickness of the nickel-plated layer 29 and silver-plated layer 30, and make the optical reflectivity of all the pads 12 uniform.

The second conductor pattern 11 is used for maintaining all the pads 12 at the same potential when the pads 12 of the first conductor pattern 10 are subjected to electrolytic plating. More specifically, the second conductor pattern 11 includes a common line 32 and a plurality of branch lines 33 as shown in FIG. 2. The common line 32 linearly extends over the whole length of the substrate 2 to run along the long side 2a of the substrate 2. At the same time, the common line 32 is separate from the end edge of the substrate 2 by a predetermined distance D, the end edge defining the long side 2a of the substrate 2.

Furthermore, the common line 32 has a plurality of curved parts 34 at positions corresponding to the piercing parts 6 of the substrate 2. Each of the curved parts 34 is arcuately curved in a direction in which a distance from the edge of the piercing part 6 becomes larger. As a result of this, by presence of the curved parts 34, the common line 32 is separate from the edges of the piercing parts 6, by at least the same distance as the distance D at positions corresponding to the piercing parts 6.

The branch lines 33 are branched from the common line 32, and linearly extend toward the pads 12. The branch lines 33 are arranged at intervals in the longitudinal direction of the substrate 2. Distal ends of the branch lines 33 are electrically connected to all the pads 12 and power supply pattern 24a of the relay conductor 15. In other words, all the pads 12 and relay conductor 15 are electrically connected to the common line 32 through the branch lines 33.

The second conductor pattern 11 is formed on the first surface 5a of the substrate 2 simultaneously with the first conductor pattern 10, and has the same three-layer structure as that of the first conductor pattern 10. Therefore, the surface of the second conductor pattern 11 is formed of a silver-plated layer, and has light reflectivity.

Each of the plurality of light-emitting elements 3 is constituted of a paired chip of light-emitting diodes (LEDs). In this embodiment, white light is emitted through the light-emitting device 1, and hence light-emitting elements 3 configured to emit blue light are used. The LED paired chip 3 is, for example, an InGaN-based element, in which light-emitting layers are formed on a translucent sapphire element board. The light-emitting layers are formed by depositing an n-type nitride semiconductor layer, InGaN light-emitting layer, and p-type nitride semiconductor layer one on top of another. Further, electrodes configured to cause a current to flow through the light-emitting layers are constituted of a positive electrode formed of a p-type electrode pad on the p-type nitride semiconductor layer, and negative electrode formed of an n-type electrode pad on the n-type nitride semiconductor layer.

The light-emitting elements 3 are individually attached to the first mounting area 16a and second mounting area 16b of each pad 12 through a silicon resin adhesive 36. More specifically, six light-emitting elements 3 are arranged in the first mounting area 16a of each pad 12 in line at intervals in the longitudinal direction of the substrate 2, and six light-emitting elements 3 are arranged in the second mounting area 16b of each pad 12 in line at intervals in the longitudinal direction of the substrate 2. Accordingly, each pad 12 includes twelve light-emitting elements 3. The light-emitting elements 3 on each pad 12 constitute two rows of light-emitting elements which are successively arranged in the longitudinal direction of the substrate 2.

Figure 3:
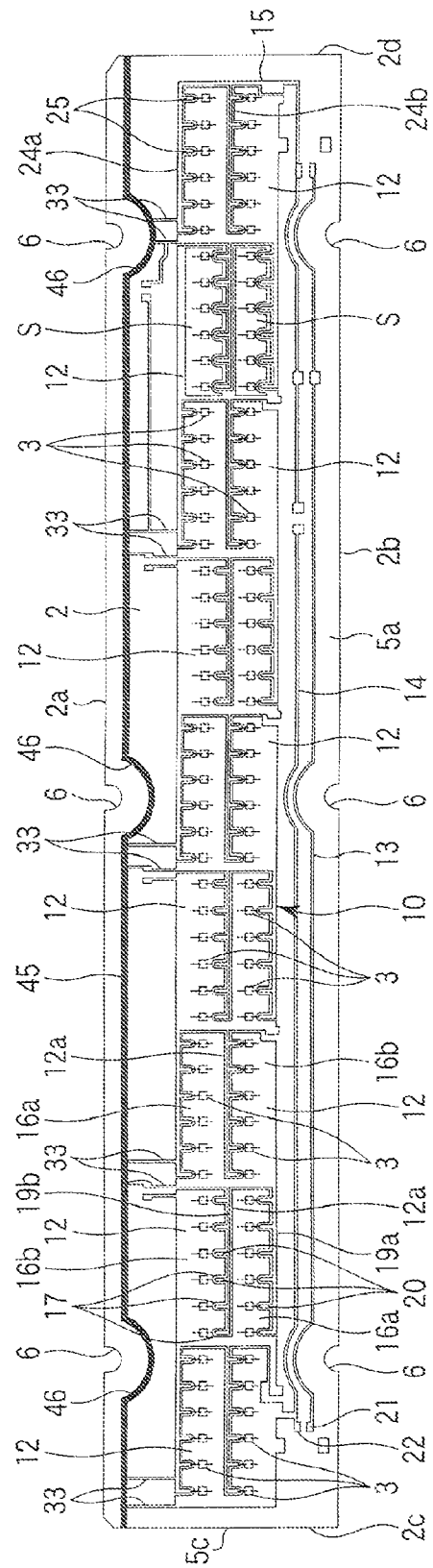
FIG. 3 is a schematic view showing a state where a second conductor pattern is removed from the substrate of FIG. 2, and a plurality of light-emitting diodes are mounted thereon.

As shown in FIG. 3 and FIG. 5, the positive electrode of each light-emitting element 3 is electrically connected to the pad 12 to which the light-emitting element 3 is affixed, through a bonding wire 38. The negative electrode of each light-emitting element 3 is electrically connected to each of the power supply terminals 20 of the adjacent pad 12 and each of power supply terminals 25 of the power supply patterns 24a and 24b by another bonding wire 39. These bonding wires 38 and 39 are constituted of a gold (Au) thin wire and, for the purpose of improving the mounting strength, and reducing the damage of the LED paired chip, are connected through bumps a chief ingredient of which is gold (Au).

Figure 6:
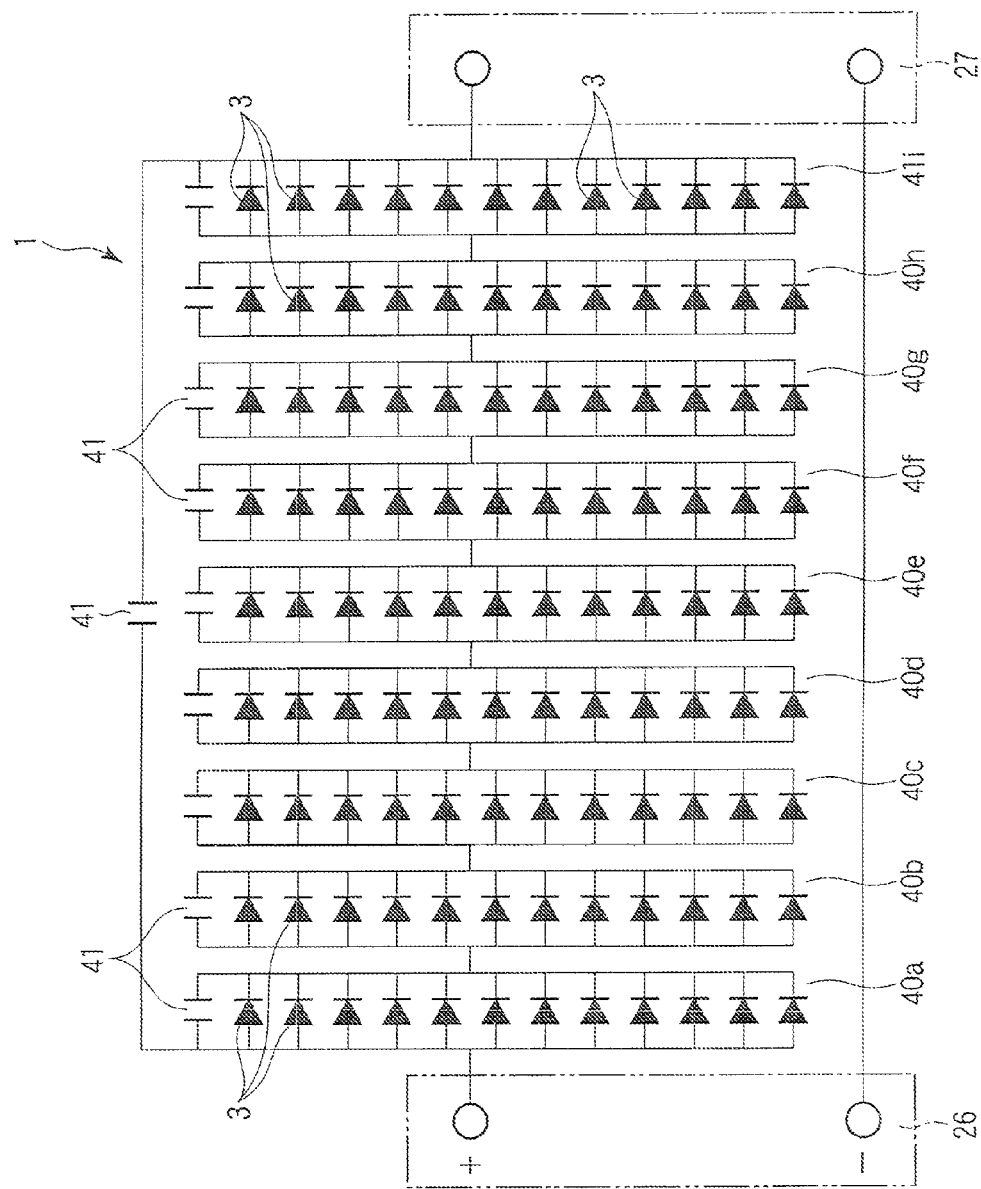
FIG. 6 is a connection diagram showing connection state of the plurality of light-emitting diodes.
Figure 7:
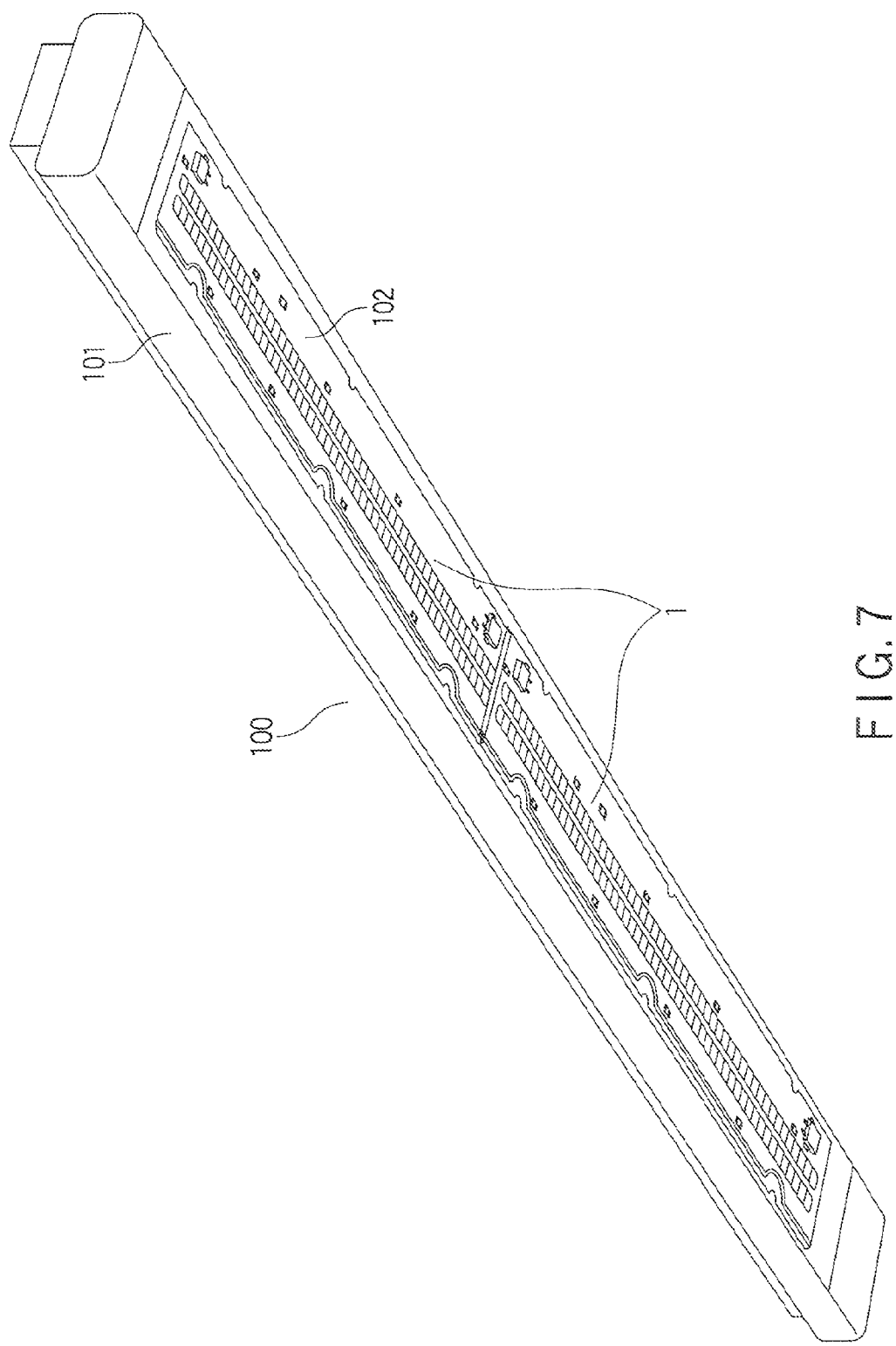
FIG. 7 is a perspective view of an illumination device in which the light-emitting device of FIG. 1 is incorporated.

Specifically, as shown in FIG. 6, the light-emitting device 1 has nine parallel circuits 40a, 40b, 40c, 40d, 40e, 40f, 40g, 40h, and 40i, in each of which twelve light-emitting elements 3 are connected in parallel. Furthermore, the nine parallel circuits 40a, 40b, 40c, 40d, 40e, 40f, 40g, 40h, and 40i are connected in series.

Moreover, in this embodiment, in order to prevent a malfunction of the light-emitting device 1, a capacitor 41 is connected to each of the nine parallel circuits 40a, 40b, 40c, 40d, 40e, 40f, 40g, 40h, and 40i. At the same time, a capacitor 41 is also connected to a circuit configured to connect the parallel circuits 40a, 40b, 40c, 40d, 40e, 40f, 40g, 40h, and 40i in series. The capacitors 41 are mounted on the first surface 5a of the substrate 2

In this embodiment, the power supply terminals 20 and 25 to which the bonding wires 39 are connected are inserted into the depressed parts 17 of the adjacent pad 12. In other words, the power supply terminals 20 and 25 advance toward the central parts of the first and the second mounting areas 16a and 16b, and hence the light-emitting elements 3 can be affixed to the central parts of the first and the second mounting areas 16a and 16b, without changing the lengths of the bonding wires 38 and 39. Therefore, it is possible to conduct the heat generated by the light-emitting elements 3 to a wide range of the first and the second mounting areas 16a and 16b, and efficiently radiate the heat from the pads 12.

The second conductor pattern 11 configured to maintain all the pads 12 at the same potential becomes useless after the first conductor pattern 10 is subjected to electrolytic plating. Therefore, in this embodiment, after the first conductor pattern 10 is subjected to electrolytic plating, the common line 32 of the second conductor pattern 11 is removed to thereby sever electrical connection between the pads 12 obtained by the second conductor pattern 11.

As shown in FIG. 3, and FIG. 5, a depressed part 45 is formed in the first surface 5a of the substrate 2. The depressed part 45 is traces which are left after the common line 32 is removed, and extends along the long side 2a of the substrate 2. The depressed part 45 is a groove which is defined by a bottom surface 45a and a pair of side surfaces 45b and 45c, and is opened to the first surface 5a of the substrate 2.

Furthermore, the depressed part 45 has a plurality of curved parts 46 at positions corresponding to the piercing parts 6 of the substrate 2. The curved parts 46 are formed into a shape coinciding with the shape of the curved parts 34 of the common line 32 in such a manner that the parts 46 detour around the piercing parts 6. The depressed part 45 having the above structure is positioned between the end edge of the substrate 2, which defines the long side 2a of the substrate 2, and the pads 12, and is separate from the end edge of the substrate 2 by a predetermined distance. According to this embodiment, the depressed part 45 has a width dimension of 1 mm, and depth dimension of 0.3 mm.

By presence of the depressed part 45 as described above, only the branch lines 33 of the second conductor pattern 11 remain on the first surface 5a of the substrate 2. The remaining branch lines 33 are electrically separated from each other.

Furthermore, a creepage distance from the end edge of the substrate 2 which defines the long side 2a of the substrate 2 to the pads 12 is a value obtained by adding the height dimensions of the side surfaces 45b and 45c of the depressed part 45 to the original distance. Therefore, the creepage distance becomes longer than the clearance (spatial distance) from the end edge of the substrate 2 to the pads 12 by a dimension corresponding to the depth of the depressed part 45. The shape of the depressed part 45 is not limited to that of this embodiment. For example, the depressed part 45 may have a V-shaped or U-shaped cross section in the direction perpendicular to the longitudinal direction of the substrate 2.

The sealing members 4a and 4b seal the light-emitting elements 3 which are arranged in two lines, and bonding wires 38 and 39 on the pads 12. The sealing members 4a and 4b are made of a transparent silicon resin in which an adequate amount of a fluorescent substance such as YAG, Ce or the like is mixed, are formed by coating in such a manner that their cross-sectional shape becomes a flat mountain shape, and linearly extend in the longitudinal direction of the substrate 2.

The fluorescent substance is excited by light emitted from the light-emitting element 3, and radiates light of a color different from the color of the light emitted from the light-emitting element 3. In this embodiment, the light-emitting element 3 emits blue light, and hence a yellow fluorescent substance configured to radiate light of the yellow color in a complementary chromatic relationship to the blue color of the light is used as the fluorescent substance so that the light-emitting device 1 can emit light of the white color.

As shown in FIG. 1 and FIG. 5, the first surface 5a of the substrate 2 is covered with a white resist layer 48, except for areas on which parts such as the light-emitting elements 3 and capacitors 41 are mounted. In order to explain the areas in which no resist layer 48 is formed in an easy-to-understand manner, in FIG. 3, an area S in which no resist layer 48 is formed is representatively shown on the second pad 12 from the right. Likewise, in each of the other eight pads 12, an area S in which no resist layer 48 is formed is present. At least a part to which a light-emitting element 3 (LED paired chip) is affixed, i.e., a mounting part of the light-emitting element 3 corresponds to the area S in which no resist layer 48 is formed. The area S is buried by the sealing member 4a or 4b to be sealed as shown in FIG. 1 and FIG. 5.

The resist layer 48 has light reflectivity. The resist layer 48 continuously covers the first conductor pattern 10, branch lines 33, and depressed part 45 except the above-mentioned areas S. Therefore, the first conductor pattern 10, branch lines 33, and depressed part 45 on the first surface 5a of the substrate 2 are not easily viewed.

As shown in FIG. 5, the pads 12 are formed on the first surface 5a of the substrate 2, and the resist layer 48 is formed on the pads 12. In a peripheral edge part of each area S in which no resist layer 48 is formed, i.e., in a boundary part at which the resist layer 48 is in contact with the area S, an engagement protrusion part 48a protruded toward the sealing member is provided to prevent exfoliation of the sealing member 4a or 4b. In this embodiment, an engagement protrusion part 48a a cross-sectional shape of which is inclined from the surface of the resist layer 48 toward the light-reflecting surface of the pad 12 in a direction in which the area S is extended is formed at the edge of the area S. It should be noted that although the engagement protrusion part 48a may be provided on the entire circumference along the edge of the resist layer 48 which is the boundary between the rest layer 48 and area S, it is sufficient if the engagement protrusion part 48a is provided at each of at least several positions on the edge of the resist layer 48 in a studding manner. Further, the shape of the engagement protrusion part 48a is not limited to that of this embodiment, and may be any such shape that when the part 48a is inserted into the sealing member 4a or 4b, the part 48a is caught on the sealing member.

The resist layer 48 is formed of a white photoresist material. Further, the resist layer 48 bears a function of reflecting light emitted from the light-emitting element 3 in the frontward direction (upward direction in FIG. 5), and function of preventing the metallic layers such as the pads 12, power supply conductors 13 and 14, and the like from being corroded. In order to reflect the light emitted from the light-emitting element 3 from the surface of the resist layer 48, it is necessary to make the top surface of the light-emitting element 3 higher than at least the surface of the resist layer 48. In other words, it is desirable that the surface of the resist layer 48 be formed at a position lower than the top surface of the light-emitting element 3.

Accordingly, in this embodiment, the thickness of each pad 12 is set at 35 µm, thickness of the resist layer 48 is set at 40 µm, and height of the light-emitting element 3 is set at 80 µm. It is desirable that the thickness of the resist layer 48 be set at a value from 30 to 40 µm and, for example, when the thickness of the resist layer 48 is to be changed to 30 µm, it is sufficient if the thickness of the pad 12 is made less than 30 µm.

Figure 4:
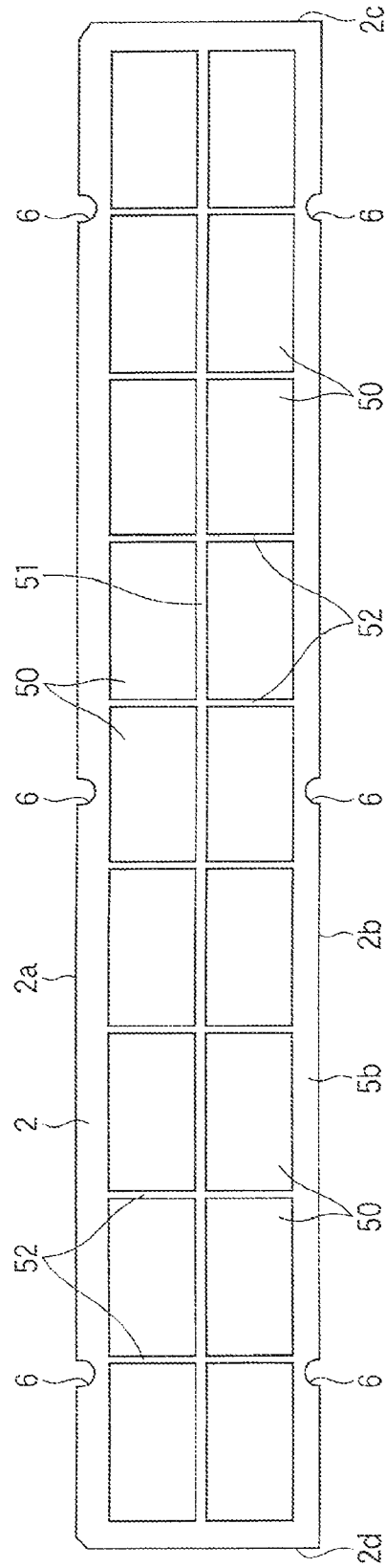
FIG. 4 is a schematic view of the substrate of FIG. 2 viewed from the back surface side.

As shown in FIG. 4 and FIG. 5, eighteen rectangular heat-radiation sheets 50 are formed on the second surface 5b of the substrate 2. The heat-radiation sheets 50 are an example of conductors, and are formed of copper foil excellent in thermal conductivity. The heat-radiation sheets 50 are arranged in two lines at intervals in the longitudinal direction of the substrate 2 in such a manner that the sheets 50 correspond to the pads 12 on the first surface 5a. Heat-radiation sheets 50 adjacent to each other are thermally separated from each other by a first slit 51 extending the longitudinal direction of the substrate 2, and a plurality of second slits 52 each extending in a lateral direction perpendicular to the longitudinal direction of the substrate 2. Furthermore, the heat-radiation sheets 50 and second surface 5b of the Substrate 2 are covered with a resist layer 53.

By forming the heat-radiation sheets 50 on the second surface 5b of the substrate 2, it is possible to uniformize temperature distribution of the substrate 2 which receives the heat of the light-emitting elements 3. Therefore, the thermal radiation performance of the substrate 2 can be enhanced. In particular, by providing the second slits 52 extending in the direction perpendicular to the longitudinal direction of the substrate 2 between the heat-radiation sheets 50 adjacent to each other, it is possible to suppress a warp and deformation of the substrate 2 caused by heat.

Next, a process of manufacturing the light-emitting device 1 will be described below with reference to FIGS. 1 to 3, and FIG. 5. It should be noted that here, a description of a process of forming the heat-radiation sheets 50 on the second surface 5b of the substrate 2 is omitted.

First, the first conductor pattern 10 and second conductor pattern 11 are formed on the first surface 5a of the substrate 2. More specifically, the copper foil deposited on the first surface 5a is etched, whereby copper layers 28 of the first and second conductor patterns 10 and 11 are formed. In, the copper layer 28 of the first conductor pattern 10, parts constituting the pads 12 are electrically connected to each other through the copper layer 28 of the second conductor pattern 11. Therefore, all the parts of the copper layer 28 of the first conductor pattern 10 each constituting the pads 12 are maintained at the same potential.

In this state, the copper layer 28 of the first conductor pattern 10 is subjected to electrolytic plating, whereby a nickel-plated layer 29 is formed on the copper layer 28. Subsequently, the nickel-plated layer 29 is subjected to electrolytic plating, whereby a silver-plated layer 30 is formed on the nickel-plated layer 29. In the step of performing electrolytic plating, all the parts in the copper layer 28 of the first conductor pattern 10 each constituting the pads 12 are maintained at the same potential. Therefore, the nickel-plated layer 29 and silver-plated layer 30 are formed on the copper layer 28 of the first conductor pattern 10 by using the copper layer 28 of the first conductor pattern 10 as a negative electrode, using a metal identical with the metal of the layer to be formed by plating as a positive electrode, and causing an electric current to flow between both the electrodes. The nickel-plated layer 29 and silver-plated layer 30 are also formed on the copper layer 28 of the second conductor pattern 11 simultaneously with the first conductor pattern 10. This state is shown in FIG. 2.

Thereafter, as shown in FIG. 3, the common line 32 of the second conductor pattern 11 is removed from the first surface 5a of the substrate 2. More specifically, the common line 32 on the first surface 5a is scraped away. As a result, electrical connection between the pads 12 of the first conductor pattern 10 and second conductor pattern 11 is severed, and the pads 12 are maintained in a state where the pads 12 are electrically independent.

When the common line 32 is scraped away from the first surface 5a, a groove-like depressed part 45 is formed in the first surface 5a. The depressed part 45 has the curved parts 46 which are curved to detour around the piercing parts 6, at positions corresponding to the piercing parts 6 of the substrate 2.

The depressed part 45 intersects the bases of the branch lines 33 branching off from the common line 32. As a result, the branch lines 33 are left on the first surface 5a of the substrate 2 in a state where the branch lines 33 are electrically separated from each other.

Thereafter, as shown in FIG. 3, six light-emitting elements 3 are affixed to each of the first and second mounting areas 16a and 16b of each pad 12. Then, the positive electrodes of the light-emitting elements 3 are electrically connected to the pads 12 to which the light-emitting elements 3 are affixed by bonding wires 38. Likewise, the negative electrodes of the light-emitting elements 3 are connected to the power supply terminals 20 of the adjacent pads 12, and power supply terminals 25 of the power supply patterns 24a and 24b by bonding wires 39.

Furthermore, thereafter, as shown in FIG. 1 and FIG. 5, a pattern of the resist layer 48 is formed on the conductor patterns 10 and 11. As described previously, the pattern of the resist layer 48 is formed on the substrate surface except the mounting areas of the light-emitting elements 3, and mounting positions of the other electronic components. In this embodiment, the resist layer 48 is formed by using a white photoresist material. Accordingly, the resist layer 48 is irradiated with ultraviolet rays to carry out exposure and development, whereby the pattern of the area S is formed.

In this case, when the ultraviolet rays are applied to the resist layer 48, part of the irradiation light passes through the resist layer 48 at the boundary part between the resist layer 48 and areas S, and is reflected from the surface of the pad 12. At this time, the irradiation direction of the ultraviolet light is inclined, whereby the light reflected from the pad 12 is directed laterally or obliquely upward, and the resist layer 48 is exposed in a concave form in the thickness dimension range of the resist layer 48. Further, through the development process to be carried out after this, the engagement protrusion part 48a having the above-mentioned cross-sectional shape is formed at the boundary part of the resist layer 48. When the engagement protrusion part 48a is formed by exposure in the manner described above, by adjusting the irradiation intensity, irradiation angle, irradiation time, and the like of the ultraviolet rays, it is possible to make the shape of the engagement protrusion part 48a a desired shape.

It should be noted that the process of forming the pattern of the resist layer 48 can also be carried out before the removal process of the above-mentioned second conductor pattern 11. In this embodiment, the resist layer 48 is formed after the second conductor pattern 11 is removed, and hence the depressed part 45 appearing after the second conductor pattern 11 is scraped away is filled with the resist layer 48 as shown in FIG. 1 and FIG. 5. However, by scraping away the second conductor pattern 11 together with the resist layer 48 after the resist layer 48 is formed, the depressed part 45 is exposed on the surface of the light-emitting device 1.

Finally, the light-emitting elements 3 arranged in two lines and the bonding wires 38 and 39 are sealed on the pads 12 by using the sealing members 4a and 4b. Hereby, the light-emitting device 1 as shown in FIG. 1 and FIG. 5 is formed.

At this time, the sealing members 4a and 4b are applied to the light-emitting elements 3 of each row and bonding wires 38 and 39 in a form of a straight line as shown in FIG. 1 in an uncured state where the members 4a and 4b are adjusted to appropriate viscosity in such a manner that the members 4a and 4b do not flow out thoughtlessly, and maintain a flat mountain shape a cross section of which is shown in FIG. 5. Hereby, as shown in FIG. 5, each of the sealing members 4a and 4b flows into a part under the engagement protrusion part 48a at the edge part of the area S in contact with the resist layer 48. Further, after the sealing members 4a and 4b are heated to be cured, or after the sealing members 4a and 4b are left as they are for a predetermined time, the sealing members 4a and 4b are cured and fixed to the areas S of the resist layer 48.

In this state, each of the engagement protrusion parts 48a is brought into a state where the part 48a is inserted into the cured sealing member 4a or 4b, and hence, for example, even when lateral force is applied to the sealing member 4a or 4b, the sealing member 4a or 4b is not easily exfoliated. Further, by providing the engagement protrusion part 48a, the edge of the area S is obliquely inclined, and hence the area in which the sealing member 4a or 4b is in contact with the resist layer 48 becomes larger correspondingly. Hereby, the adhesive strength of the sealing members 4a and 4b is enhanced with respect to the resist layer 48.

Next, the illumination device 100 in which the above-mentioned light-emitting device 1 is incorporated will be described below with reference to FIG. 7. Here, the illumination device 100 to be described is, for example, an illumination device of the ceiling mounting type which is mounted on the ceiling of a room to be used.

The illumination device 100 is provided with a main body case 101 having substantially a long and thin parallelepiped-shape. In this main body case 101, a plurality of (two in this embodiment) light-emitting devices 1 described above are connected and arranged side by side in the longitudinal direction. Further, a power supply unit (not shown) provided with a power supply circuit (not shown) is incorporated in the main body case 101. It should be noted that a front cover 102 having light-diffusing properties is attached to a lower opening part of the main body case 101.

When the two light-emitting devices 1 are energized by the power supply circuit, a plurality of light-emitting elements 3 are turned on all at once, and light is emitted from each of the plurality of light-emitting elements 3. The light emitted from each of the plurality of light-emitting elements 3 passes through a sealing member 4a or 4b, and is utilized as white illumination light. That is, the illumination device 100 is used as a surface light source.

While the illumination device 100 is lighting, the pads 12 function as a heat spreader configured to spread heat generated from the light-emitting elements 3. Furthermore, while the light-emitting devices 1 are emitting light, part of the light emitted from the light-emitting elements 3, the part of the light being directed toward the substrate 2 side, is reflected from the reflecting layer on the surface side of the pads 12 mostly in the light-utilization direction. Accordingly, it is possible to make the light-extraction efficiency excellent.

Hereinafter, advantages of the above-mentioned first embodiment will be described.

The second conductor pattern 11 which maintains the pads 12 of the first conductor pattern 10 at the same potential is constituted of the common line 32 and the branch lines 33 that are branched off from the common line 32 and reach the pads 12. Therefore, electrical connection between the pads 12 obtained by the second conductor pattern 11 can be severed by removing the common line 32 from the substrate 2.

Therefore, it is possible to efficiently and easily carry out the work of cutting off electrical connection between the pads 12, and improve the productivity of the light-emitting device 1.

Moreover, the depressed part 45 which is left after the common line 32 is scraped away is separate from the end edge of the substrate 2 by the predetermined distance, and, is positioned between, the end edge of the substrate 2 and pads 12. As a result, the creepage distance between the end edge of the substrate 2 and pads 12 becomes longer than the clearance (spatial distance) between the end edge of the substrate 2 and pads 12 by a length corresponding to the depth of the depressed part 45, and it is possible to secure an insulation distance from the end edge of the substrate 2 to the pads 12.

In addition, the depressed part 45 has the curved parts 46 which are curved to detour around the piercing parts 6 at positions corresponding to the piercing parts 6 of the substrate 2. Therefore, it is possible to equally secure insulating distances from the edges of the piercing parts 6 to the curved parts 46, and improve the dielectric strength of the substrate 2. Thus, even when the screws 8 to be inserted through the piercing parts 6 are formed of metal, insulation between the screws 8 and pads 12 can be sufficiently secured, and the reliability of electrical insulation of the light-emitting device 1 can be improved.

Further, according to the first embodiment described above, the sealing members 4a and 4b are cured in a state where the engagement protrusion part 48a is accepted into each of the sealing members 4a and 4b, and hence it is possible to prevent the fault of exfoliation of the sealing members 4a and 4b from the surface of the substrate 2 from occurring. In particular, by providing the engagement protrusion parts 48a to be buried in the sealing members 4a and 4b, it is possible to enhance the adhesive strength of the sealing members 4a and 4b with respect to the resist layer 48.

Furthermore, in this embodiment, the surface of the resist layer 48 is formed at a position lower than the height of the top surface of the light-emitting element 3, and hence it is possible to reduce the degree to which the resist layer 48 is a hindrance to the light emitted from the light-emitting elements 3, and enhance the luminous efficacy.

(Second Embodiment)

Next, a light-emitting device 60 according to a second embodiment will be described below with reference to FIG. 8.

The light-emitting device 60 of this embodiment has substantially the same structure as the light-emitting device 1 of the first embodiment described above except for that sealing members 4c configured to individually cover and seal light-emitting elements 3 are provided in place of the sealing members 4a and 4b. Accordingly, parts identical with or corresponding to those of the first embodiment are denoted by the identical reference symbols, and a duplicated description will be omitted.

A resist layer 48 of this embodiment includes a plurality of substantially circular areas S (not shown) in which a plurality of light-emitting elements 3 are individually exposed. The plurality of areas S are patterned in the resist layer 48 as in the case of the first embodiment described above. That is, an area S which is a size smaller than each of a plurality of sealing members 4c provided to correspond to the light-emitting elements 3 is formed around each of the light-emitting element 3. In this case, at an edge of each area S of the resist layer 48, an engagement protrusion part 48a a cross section of which is as shown in FIG. 5 is provided in a protruding manner.

Thus, in this embodiment too, a plurality of sealing members 4c are provided to cover the plurality of areas S of the resist layer 48, whereby each sealing member 4c is fastened to the resist layer 48, and the sealing members 4c are not easily exfoliated from the resist layer 48. In particular, by providing a plurality of areas S in the resist layer 48 as in this embodiment, it is possible to provide more (longer) engagement protrusion parts 48a, and further enhance the adhesive strength of the sealing members 4c. Further, according to this embodiment, the plurality of small sealing members 4c are used, and hence it is possible, as compared with the first embodiment, to reduce the amount of the sealing members, reduce the material cost, reduce the degree to which the resist layer 48 is a hindrance to the light emitted from the light-emitting elements 3, and make the luminous efficacy excellent.

(Third Embodiment)

Figure 9:
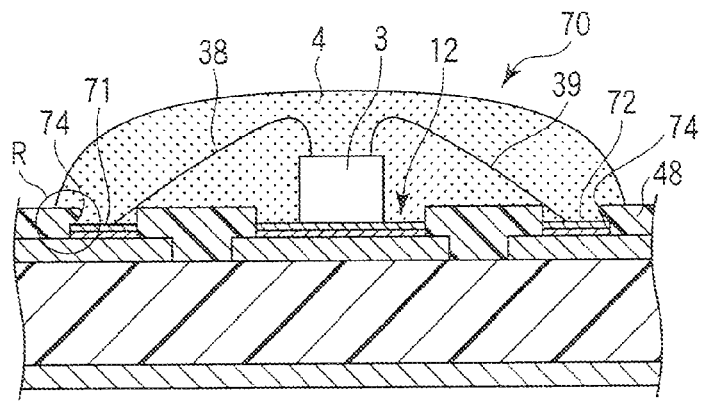
FIG. 9 is a cross-sectional view of a light-emitting device according to a third embodiment.
Figure 10:
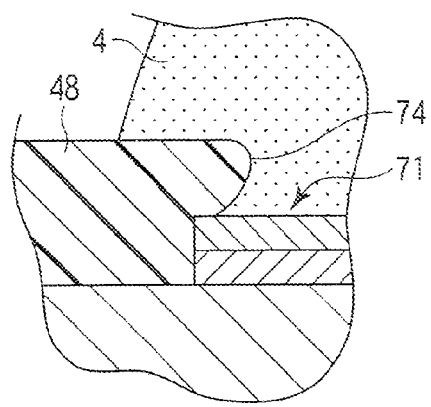
FIG. 10 is a partially-enlarged cross-sectional view in which an important part of FIG. 9 is partially enlarged.

Next, a light-emitting device 70 according to a third embodiment will be described below with reference to FIG. 9 and FIG. 10. FIG. 9 shows a cross-sectional view obtained by partially enlarging an important part of the light-emitting device 70. Further, FIG. 10 shows a cross-sectional view obtained by enlarging an area R of FIG. 9. The light-emitting device 70 of this embodiment has a structure identical with the first embodiment or the second embodiment described above except for the structure shown in FIG. 9. Accordingly, here, the configurations identical with the above-mentioned embodiments are denoted by identical reference symbols, and a detailed description of them will be omitted.

According to this embodiment, bonding wires 38 and 39 configured to electrically connect a light-emitting element are respectively connected to electrode pads 71 and 72 that are electrically independent of a pad 12 to which the light-emitting element 3 is attached. Further, an engagement protrusion part 74 of a resist layer 48, the engagement protrusion part 74 being configured to prevent exfoliation of a sealing member 4 (4a, 4b, 4c), is provided at each of edge parts of the resist layer 48 on the separate side of each of the electrode pads 71 and 72 from the light-emitting element 3.

The engagement protrusion part 74 of this embodiment has a cross-sectional shape gently curved in the thickness direction of the resist layer 48 to connect a top surface of the resist layer 48 and a surface of the electrode pad 71 (72) to each other as shown in FIG. 10. As described above, the cross-sectional shape of the engagement protrusion part 74 can be arbitrarily set by adjusting the irradiation intensity, irradiation angle, irradiation time, and the like of the ultraviolet rays.

As described above, according to this embodiment, in addition to that it is possible to exert the advantages identical with the first and second embodiments, it is possible to make the adhesive strength of the sealing member 4 stronger with respect to the engagement protrusion part 74 of the resist layer 48. In other words, it is possible to make the area in which the sealing member 4 is in contact with the resist layer 48 larger than the case where the edge of the resist layer 48 is inclined straight as in the first and second embodiments, and it is possible to further enhance the adhesive strength between the member 4 and layer 48.

Figure 11:
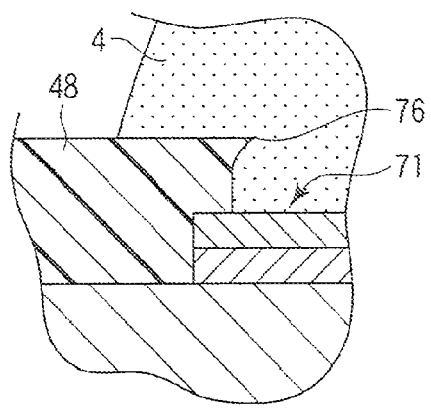
FIG. 11 is a cross-sectional view showing a modification example of the light-emitting device of FIG. 9.

FIG. 11 shows a modification example of the engagement protrusion part 74 of FIG. 10. An engagement protrusion part 76 according to this modification example has a cross-sectional, shape in which a part of the resist layer 48 on the top surface side thereof separate from the surface of the electrode pad 71 (72) is sharp, and which is curved leftwardly in FIG. 11 from the sharp distal end toward the electrode pad 71 (72) to scoop out the edge of the resist layer 48. The engagement protrusion part 76 according to this modification example also functions in the same manner as the engagement protrusion part of each of the first to third embodiments, and can prevent exfoliation of the sealing member 4. In particular, in this engagement protrusion part 76, the area in which the resist layer 48 is in contact with the sealing member 4 is larger than the first and second embodiments, and hence the adhesive strength can be made high.

According to the light-emitting device and illumination device of at least one of the embodiments described above, by having an engagement protrusion part at an edge of the resist layer around an area S in which the light-emitting element 3 is exposed on the surface side, it is possible to prevent exfoliation of the sealing member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the embodiments described above, although the resist layer has been formed by using the photoresist material, the material of the resist layer is not limited to this material. Any material may be used if the above-mentioned engagement protrusion part configured to prevent exfoliation of the sealing member can be formed or, alternatively, other means for constituting the engagement protrusion part may be applied.

Further, in the embodiments described above, although the pad used to attach the light-emitting element is used as a wiring pattern, it is not always necessary to use the pad as a wiring pattern. For example, there are cases where it is sufficient if the pad has a function of serving as a heat spreader configured to conduct and spread heat generated from the light-emitting element 3 or has a function of reflecting light.

Further, the light-emitting element may also be configured to directly emit red light, green light or blue light without using, for example, a fluorescent substance in the sealing member.

Furthermore, the illumination device can be applied to a lighting fixture to be used indoors or outdoors, light source of a display device, and the like.

What is claimed is:

1. A light-emitting device comprising:
   a light emitting element;
   a substrate comprising a surface, the surface comprising a first area on which the light emitting element is mounted and a second area surrounding the first area;
   a light reflection layer laminated on the second area of the substrate surface, the light reflection later comprising:
      a surface arranged such that the entire surface of the light reflection layer is positioned higher than the surface of the substrate and lower than a height of the light emitting element mounted on the substrate; and
      an edge part located at a boundary between the first and second areas of the substrate surface;
   an engagement protrusion part formed at the edge part of the light reflection layer, the engagement protrusion part protruding toward an inner side of the first area of the substrate surface so that an area of a portion of the light reflection layer laminated on the substrate surface is less than an area of a side of the light reflection layer opposite the portion of the light reflection layer laminated on the substrate surface; and
   a sealing member configured to seal the light emitting element, the first area, and the engagement protrusion part.

2. The light-emitting device according to claim 1, wherein the engagement protrusion part is formed by inclining the edge part of the light reflection layer from the surface of the light reflection layer in a direction toward the first area of the substrate surface.

3. An illumination device comprising:
   a device main body; and
   the light-emitting device of claim 2 arranged in the device main body.

4. The light-emitting device according to claim 1, wherein the engagement protrusion part is formed by curving the edge part of the light reflection layer to protrude the edge part in a direction toward the first area of the substrate surface.

5. An illumination device comprising:
   a device main body; and
   the light-emitting device of claim 4 arranged in the device main body.

6. An illumination device comprising:
   a device main body; and
   the light-emitting device of claim 1 arranged in the device main body.

7. A light-emitting device comprising:
   a substrate comprising a surface, the surface comprising a first area and a second area surrounding the first area;
   a light emitting element mounted on the first area of the substrate surface;
   a light reflection layer formed on the second area of the substrate surface;
   an engagement protrusion part formed at an edge part of the light reflection layer, the edge part being located at a boundary between the first and second areas of the substrate surface; and
   a sealing member configured to seal the light emitting element, the second area, and the engagement protrusion part;
   wherein the engagement protrusion part is formed by curving the edge part of the light reflection layer to scoop out the light reflection layer from the surface of the light reflection layer toward the surface of the substrate.

8. An illumination device comprising:
a device main body; and
the light-emitting device of claim 7 arranged in the device main body.

* * * * *